United States Patent
Nakazawa

[19]
[11] Patent Number: 6,134,428
[45] Date of Patent: Oct. 17, 2000

[54] WRIST MOUNTED COMMUNICATOR

[75] Inventor: Toshihiko Nakazawa, Suwa, Japan

[73] Assignee: Seiko Epson Corporation, Tokyo, Japan

[21] Appl. No.: 08/860,632

[22] PCT Filed: Nov. 5, 1996

[86] PCT No.: PCT/JP96/03235

§ 371 Date: Sep. 25, 1997

§ 102(e) Date: Sep. 25, 1997

[87] PCT Pub. No.: WO97/17766

PCT Pub. Date: May 15, 1997

[30] Foreign Application Priority Data

Nov. 6, 1995 [JP] Japan .................................. 7-287696

[51] Int. Cl.[7] .................................................. H04Q 7/32
[52] U.S. Cl. ........................................ 455/300; 455/501
[58] Field of Search .................................. 455/344, 501, 455/63, 90, 252.1, 254, 300, 274, 301, 347; 343/718, 732; 361/818, 814, 816, 736, 737, 746, 748, 752; 340/825.44

[56] References Cited

U.S. PATENT DOCUMENTS

| | | | |
|---|---|---|---|
| 5,134,724 | 7/1992 | Gehring et al. | 455/344 |
| 5,159,713 | 10/1992 | Gaskill et al. | 455/344 |
| 5,179,733 | 1/1993 | Matsui | 455/344 |
| 5,532,705 | 7/1996 | Hama | 343/718 |
| 5,564,096 | 10/1996 | Hama et al. | 455/300 |
| 5,589,840 | 12/1996 | Fujisawa | 343/718 |
| 5,737,272 | 4/1998 | Uchiyama et al. | 345/206 |

FOREIGN PATENT DOCUMENTS

| | | |
|---|---|---|
| 57-183100 | 11/1982 | Japan . |
| 61-64758 | 5/1986 | Japan . |
| 4-211198 | 8/1992 | Japan . |
| 4-317357 | 11/1992 | Japan . |
| 4-317358 | 11/1992 | Japan . |
| 4-317359 | 11/1992 | Japan . |
| 4-340732 | 11/1992 | Japan . |
| 4-340733 | 11/1992 | Japan . |
| 4-340734 | 11/1992 | Japan . |
| 5-259217 | 10/1993 | Japan . |
| 5-259218 | 10/1993 | Japan . |
| 5-259219 | 10/1993 | Japan . |
| 5-315470 | 11/1993 | Japan . |
| 5-315471 | 11/1993 | Japan . |
| 5-315472 | 11/1993 | Japan . |
| 6-45400 | 2/1994 | Japan . |
| 6-45401 | 2/1994 | Japan . |
| 6-45402 | 2/1994 | Japan . |
| 6-232199 | 8/1994 | Japan . |
| 6-232200 | 8/1994 | Japan . |
| 6-232201 | 8/1994 | Japan . |

*Primary Examiner*—William G. Trost
*Assistant Examiner*—Jean Gelin
*Attorney, Agent, or Firm*—Oliff & Berridge, PLC

[57] ABSTRACT

A highly sensitive communicator that disposes an IC serving as a high frequency noise generator to reduce the effect of the high-frequency noise. The active surfaces of a high-frequency analog IC and a signal-processing digital IC face toward a liquid crystal display panel disposed at the front of the communicator and do not face a loop antenna formed in a watchband at the rear. Therefore, even if the high-frequency analog IC and the signal-processing digital IC emit high-frequency noise from the active surfaces the high-frequency noise is unlikely to reach the loop antenna. Therefore, the communicator has high sensitivity.

12 Claims, 15 Drawing Sheets

WRIST MOUNTED COMMUNICATOR

TECHNICAL FIELD

The present invention relates to communication apparatuses such as receivers and transmitters. The present invention more specifically relates to a technology for effectively reducing an effect of high-frequency noise generated by an integrated circuit (hereinafter called IC) in a communication apparatus, on an antenna body.

BACKGROUND ART

As a portable transmitter or receiver, a watch with an FM radio and a watch-shaped individual-selective-calling receiver have been known. In such a watch-type apparatus, an electrically conductive plate member or film is put in a watchband for mounting an apparatus body at a wrist. Therefore, when the watchband is mounted at the wrist, a loop antenna is formed by the plate member or film.

In such a communication apparatus, as typically shown in FIG. 9(b), the apparatus body includes a circuit board 73 on which a high-frequency analog IC 93B for transmission or receiving and a signal-processing digital IC 94B which is driven by a driving signal having a frequency as high as several MHz are mounted. These ICs (collectively indicated by A•B-IC in the figure) are wire-bonded on the rear surface section 732 of the circuit board 73 at the rear surface side (side where the entire or most part of a loop antenna 4 is disposed) of the circuit board 73. At the front surface side (side where a liquid crystal display panel 6 is disposed) of the circuit board 73, a display digital IC 95B (indicated by C-IC in the figure) which is driven by a several-tens-of-kHz driving signal is mounted on the front surface section 721 of a circuit board 72 by wire bonding.

Through various examinations into the effect of high-frequency noise in a wrist-mount-type communication apparatus, the inventor of this application found that sensitivity is low when the high-frequency analog IC 93B or the signal-processing digital IC 94B is wire-bonded to the rear surface section 732 of the circuit board 73. In other words, irrespective of high-frequency noise generated from the active surface (meaning a surface on which leads are exposed, a wiring surface, and a device surface) 930B or 940B of the high-frequency analog IC 93B or the signal-processing digital IC 94B, when the high-frequency analog IC 93B or the signal-processing digital IC 94B is disposed conventionally such that the active surface 930B or 940B faces the loop antenna 4, it is because the loop antenna 4 is susceptible to the effect of the high-frequency noise.

In consideration of the foregoing problem, it is an object of the present invention to provide a highly sensitive communication apparatus which reduces the effect of high-frequency noise generated from the active surface of an IC by appropriately disposing the IC that serves as a noise source.

DISCLOSURE OF INVENTION

To solve the foregoing problem, the object of the present invention is achieved through the provision of a communication apparatus including a board on which an integrated circuit generating high-frequency noise is mounted; and an antenna body the entire or most of which is disposed on one board-surface side of the board, wherein the integrated circuit is mounted on the board such that the active surface thereof directs at the direction opposite the direction where the entire or most of the antenna body is disposed against the board.

In a communication apparatus according to the present invention, since the active surface of an integrated circuit generating high-frequency noise directs at the direction opposite the direction where the entire or most of the antenna body is disposed, even if the integrated circuit emits high-frequency noise from its active surface, the high-frequency noise unlikely reaches the antenna body. Therefore, the sensitivity of the communication apparatus can be increased.

To make such a communication apparatus to be of a wrist-mount-type, the communication apparatus is, for example, provided with an apparatus body in which a side on which a display screen is formed is set to a front surface side and a watchband extending from the apparatus body toward the rear surface side for mounting the apparatus body to the wrist, and the antenna body is formed in the watchband, and the board is disposed at the rear surface side of the display screen in the apparatus body.

In the present invention, an integrated circuit generating the high-frequency noise includes, for example, a high-frequency analog integrated circuit having at least one of functions between a transmission function and a receiving function, a signal-processing digital integrated circuit driven by a high-frequency driving signal, or a CPU.

In the present invention, to mount the integrated circuit such that the active surface directs at the direction opposite the direction where the entire or most of the antenna body is disposed against the board, the integrated circuit is, for example, face-down-bonded to a board surface where the entire or most of the antenna body is disposed in the board.

The integrated circuit may be wire-bonded to the board surface opposite the surface where the entire or most of the antenna body is disposed in the board so that the active surface of the integrated circuit directs at the direction opposite the direction where the entire or most of the antenna body is disposed against the board.

In the present invention, face-down bonding means all methods for electrically connecting electrodes by adhering a surface electrode or a wiring lead mounted in advance on a semiconductor chip for an integrated circuit to a wiring electrode formed on a board with both front surfaces thereof facing each other, and includes flip-chip bonding.

REFERENCE NUMERALS

1: Wrist-mount-type communication apparatus
2: Apparatus body
4: Loop antenna (antenna body)
4R, 4L: Watchbands
5: Circuit assembly
6: Liquid crystal display panel (display screen)
41, 42: Antenna bodies
71, 72, 73, 74, 75: Circuit boards
90A, 95A: Digital ICs for processing display data
91A, 93A, 96, 98: High-frequency analog ICs generating high-frequency noise
92A, 94A, 97, 99: Signal-processing digital ICs generating high-frequency noise
910A, 920A, 930A, 940A, 960, 970, 980, 990: Active surfaces of ICs

BEST MODE FOR CARRYING OUT THE INVENTION

According to the drawings, an embodiment of the present invention will be described.

Embodiment 1

Figure 1:
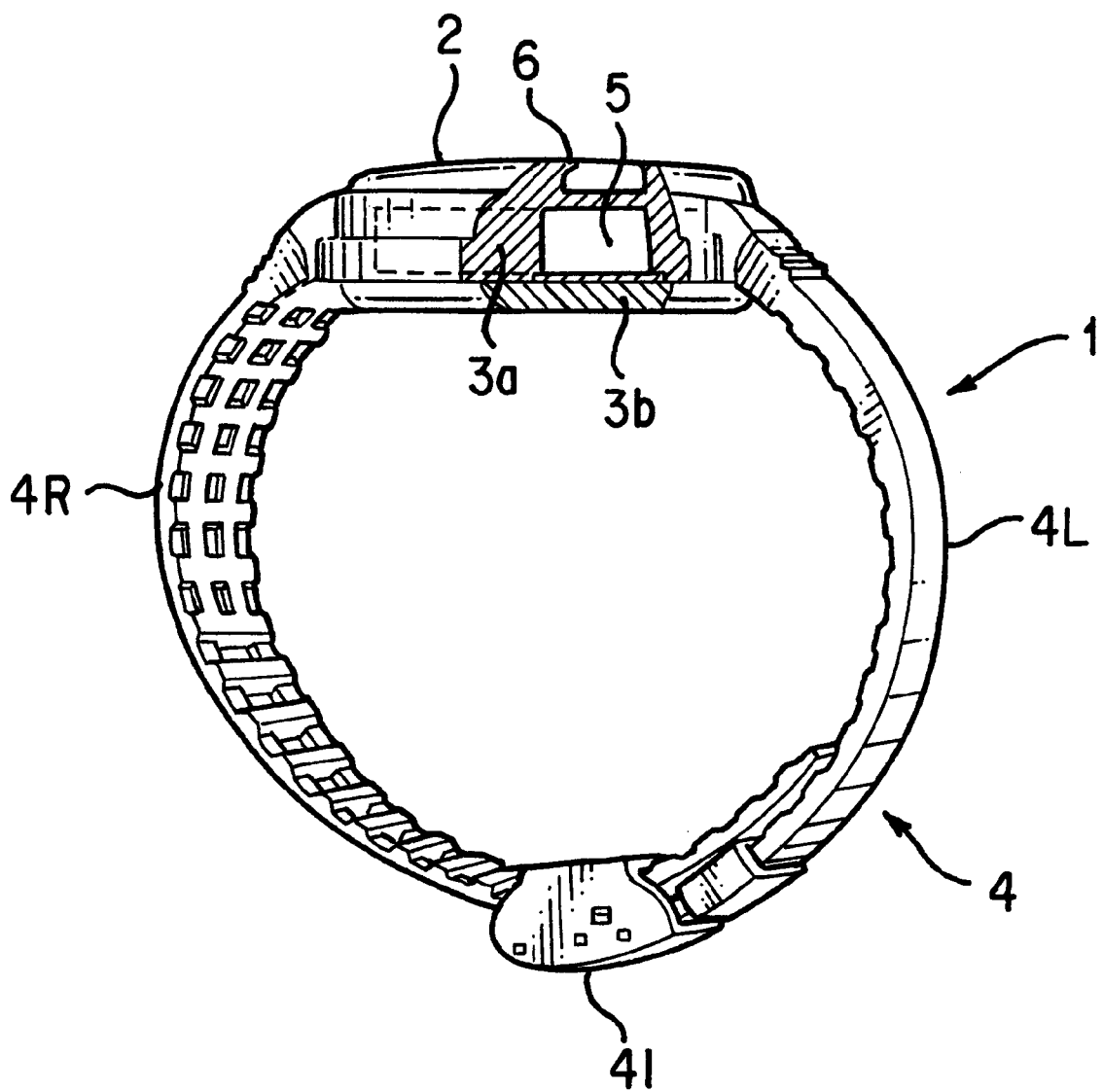
FIG. 1 is a view indicating the entire structure of a wrist-mount-type communication apparatus according to an embodiment of the present invention.

FIG. 1 is a view indicating a configuration of a wrist-mount-type communication apparatus to which the present invention is applied.

In FIG. 1, the wrist-mount-type communication apparatus 1 is formed by an apparatus body 2 which has a liquid crystal display panel 6 (display screen) disposed on the front surface side thereof and a pair of watchbands 4R and 4L. Each of the watchbands 4R and 4L is mounted to both ends of the apparatus body at each watchband main end.

These wrist bands can be connected to each other at each sub end by a buckle 41.

The watchbands 4R and 4L are provided with electrically conductive plates thereinside and mounted at the wrist of the user. When the sub ends of the watchbands 4R and 4L are connected, they form a loop antenna 4 (antenna body).

The apparatus body 2 is formed by a front-surface-side casing 3a and a rear cover 3b secured to the rear side of the casing 3a at the rear side of the apparatus body 2. A circuit assembly 5 is built in the apparatus body 2, which is formed by the casing 3a and the rear cover 3b.

Figures 2A, 2B:
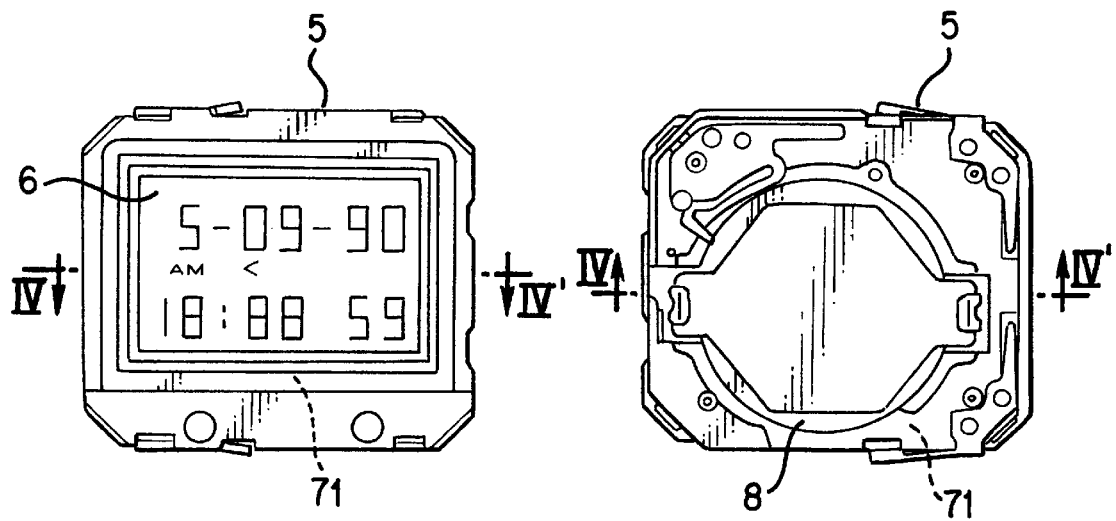
FIG. 2(a) is a plan of a circuit assembly mounted on the wrist-mount-type communication apparatus shown in FIG. 1.
FIG. 2(b) is a bottom view thereof.
Figure 3A:
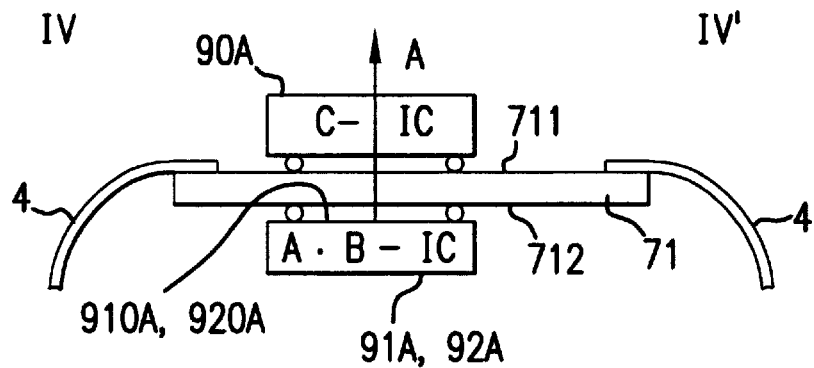
FIG. 3(a) is a view typically indicating a cross section taken on line IV–IV' of the circuit assembly according to embodiment 1 shown in FIG. 2.

FIG. 2(a) and (b) show the front and rear surfaces of the circuit assembly 5, respectively. FIG. 3(a) is a typical cross-sectional view of the circuit assembly 5 taken on line IV–IV' shown in FIG. 2.

In these figures, main components of the circuit assembly 5 are laminated in the thickness direction of the apparatus body 2 in its inside. In other words, in the circuit assembly 5, the liquid crystal display panel 6, a circuit board 71, and a battery 8 for driving the circuit are disposed in the thickness direction.

The loop antenna 4 is electrically and mechanically connected to terminal sections of the circuit board 71. These terminal sections are connected to a digital IC 90A. The loop antenna 4 is held by the watchbands 4R and 4L, and extends to the rear surface side of the circuit board 71. The loop antenna 4 is not necessarily directly secured to the circuit board 71. The loop antenna 4 needs to be electrically connected to terminal sections of the circuit board 71. It may be pressure-connected, or wire-connected with leads.

Various electronic components are mounted on the circuit board 71. Of the front surface side (side where the liquid crystal display panel 6 is disposed) thereof and the rear surface side (side where the entire or most of the loop antenna 4 is disposed), to the front surface section 711 opposing the liquid crystal display panel 6, the digital IC 90A (indicated by C-IC in the figure) for controlling display operations in the liquid crystal display unit 6 is adhered and electrically connected by face-down bonding method such as flip chip bonding.

At the rear surface side where most part of the loop antenna 4, which is formed by connecting the sub ends of the watchbands 4R and 4L mounted at the wrist, is disposed, on the rear surface section 712 of the circuit board 71, a high-frequency analog IC 91A having transmission and receiving functions and a signal-processing digital IC 92A are mounted. These ICs (collectively indicated by A•B-IC in the figure) are also face-down-bonded to the circuit board 71. Therefore, the active surfaces 910A and 920A of the high-frequency analog IC 91A and the signal-processing digital IC 92A face the circuit board 71 (side where the liquid crystal display panel 6 is disposed) and do not face the direction where most of the loop antenna 4 is disposed.

The digital IC 90A for liquid crystal display is driven by a driving signal having a frequency as relatively low as several tens of kHz, and does not generate high-frequency noise. On the other hand, since the high-frequency analog IC 91A transmits and receives high-frequency signals in the range of several tens of MHz to several hundreds of MHz, it generates high-frequency noise as shown by arrow A. Since the signal-processing digital IC 92A includes a digital circuit for sampling a received signal before analog/digital conversion and a phase locked loop circuit, and is driven by a driving signal having a frequency as high as several MHz, it generates high-frequency noise as indicated by arrow A.

In this embodiment, however, since the high-frequency analog IC 91A and the signal-processing digital IC 92A both generating high-frequency noise are disposed at the rear surface side of the circuit board 71 with the active surfaces 910A and 920A thereof directing the side (side where the liquid crystal display panel 6 is disposed) of the circuit board 71 and not directing the direction where most of the loop antenna 4 is disposed, the effect of the high-frequency noise generated by them is unlikely to reach the loop antenna 4. Therefore, the wrist-mount-type communication apparatus 1 to which the present invention is applied has high sensitivity.

Figure 3B:
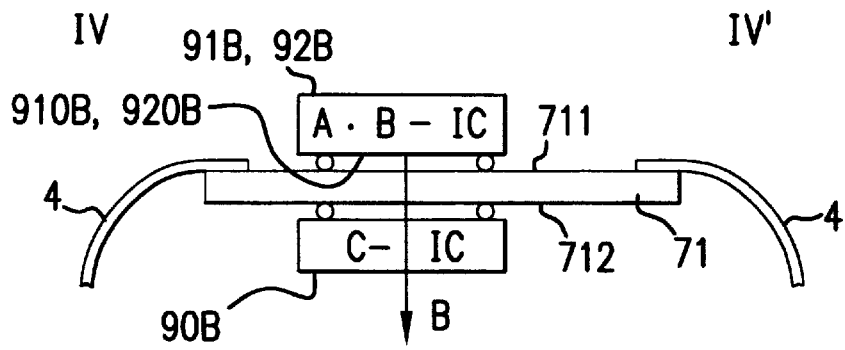
FIG. 3(b) is a view typically indicating a cross section taken on a position corresponding to line IV–IV' shown in FIG. 2 of a circuit assembly according to a comparison case.

To examine the noise reduction effect, the structure in the present embodiment shown in FIG. 3(a) and a structure in a comparison case shown in FIG. 3(b) in which a digital IC 90B (indicated by C-IC in the figure) for controlling display operations in the liquid crystal display panel 6 is face-down bonded to the rear surface section 712 of the circuit board 71 and a high-frequency analog IC 91B and a signal-processing digital IC 92B both serving as high-frequency noise generation sources are face-down bonded to the front surface section 711 of the circuit board 71 are relatively compared in terms of sensitivity in receiving.

Figure 4:
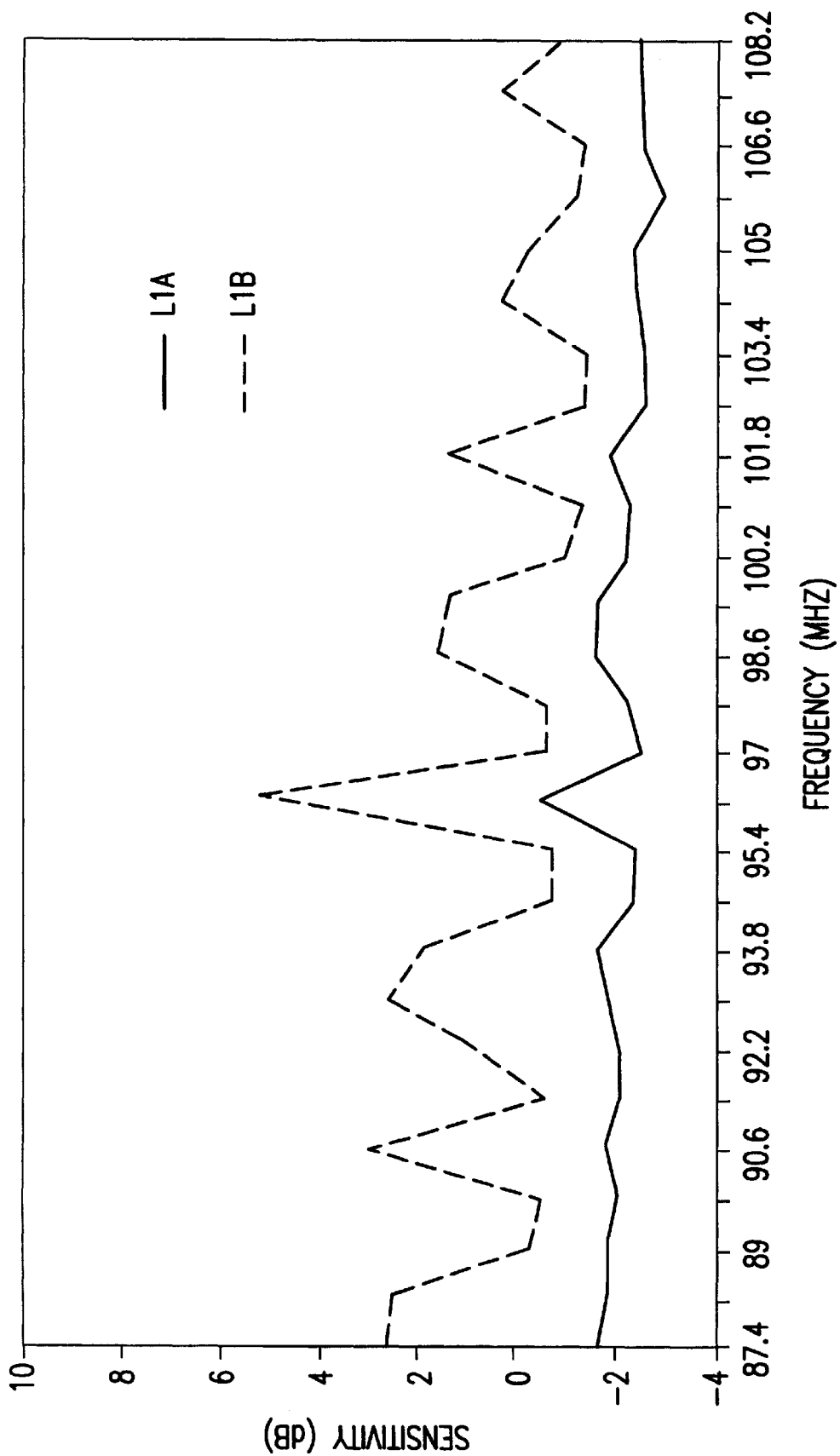
FIG. 4 is a graph indicating a comparison between the sensitivity characteristics of a wrist-mount-type communication apparatus using the structure according to embodiment 1 shown in FIG. 3(a) and the sensitivity characteristics of a wrist-mount-type communication apparatus using the structure according to the comparison case shown in FIG. 3(b).

In FIG. 4, receiving sensitivity measured in a frequency range of 87.4 MHz to 108.2 MHz in the wrist-mount-type communication apparatus 1 according to the present embodiment in which the high-frequency analog IC 91A and the signal-processing digital IC 92A both serving as high-frequency noise generation sources are face-down bonded to the rear surface section 712 of the circuit board 71 to direct the active surfaces 910A and 920A thereof toward the liquid crystal display panel 6 is indicated by a broken line L1A. In FIG. 4, receiving sensitivity measured in a frequency range of 87.4 MHz to 108.2 MHz in the wrist-mount-type communication apparatus 1 according to the comparison case in which the high-frequency analog IC 91B and the signal-processing digital IC 92B both serving as high-frequency noise generation sources are face-down bonded to the front surface section 711 of the circuit board 71 to direct the active surfaces 910B and 920B thereof toward the loop antenna 4 is indicated by a broken line L1B.

The vertical axis in FIG. 4 indicates relative sensitivity with the reference sensitivity level being set to 0 dB.

As clearly understood from this figure, in the structure according to the present embodiment, high-frequency noise emitted from the active surfaces 910A and 920A of the high-frequency analog IC 91A and the signal-processing digital IC 92A is not emitted toward the loop antenna 4 as shown by arrow A in FIG. 3(a), whereas in the structure according to the comparison case, high-frequency noise emitted from the active surfaces 910B and 920B of the high-frequency analog IC 91B and the signal-processing digital IC 92B is emitted toward the loop antenna 4 as shown by arrow B in FIG. 3 (b). Therefore, in the structure according to the present embodiment, sensitivity is higher in any frequencies ranging from 87.4 MHz to 108.2 MHz than in the structure according to the comparison case. In other words, sensitivity in the structure according to the present embodiment is −2.5 dB in relative sensitivity against the reference sensitivity, whereas sensitivity in the structure in the comparison case is −1.0 dB in relative sensitivity against the reference sensitivity. According to the structure of the present embodiment, sensitivity increases by 1.5 dB.

Figure 5:
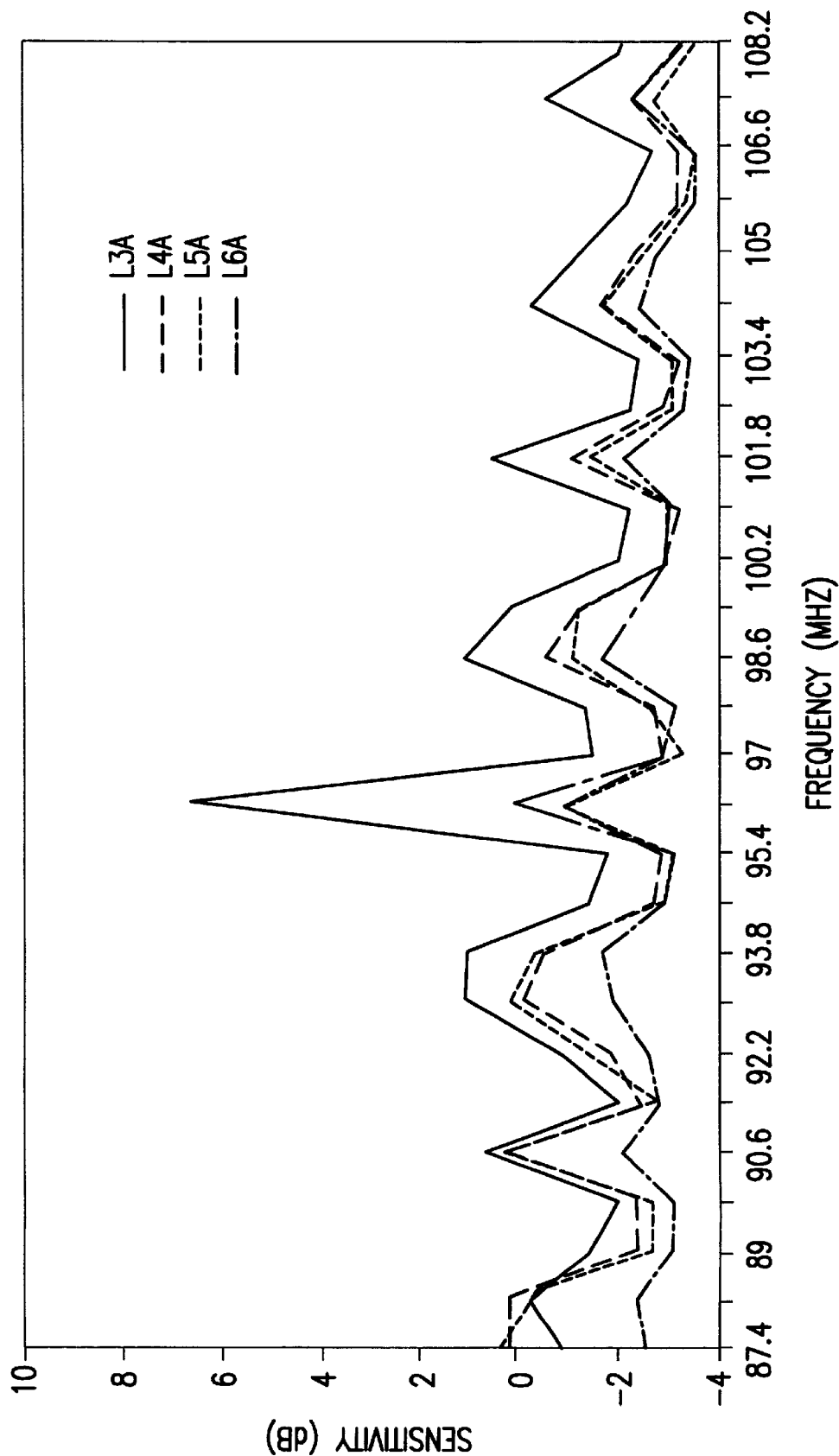
FIG. 5 is a graph indicating the sensitivity characteristics of a wrist-mount-type communication apparatus using the structure according to embodiment 1 shown in FIG. 3 (a), with assembly conditions being changed.

In FIG. 5, in a wrist-mount-type communication apparatus using the structure according to the present embodiment, sensitivity in the communication apparatus which has the circuit board 71 on which each IC is mounted as is is indicated by a broken line L3A, sensitivity in the communication apparatus in which the side of the circuit board 71 at which the high-frequency analog IC 91A is mounted is entirely shielded and a circuit-driving battery 8 is disposed such that it faces the rear surface side of the circuit board 71 is indicated by a broken line L4A, sensitivity in the communication apparatus in which both sides of the circuit board 71 are entirely shielded and the circuit-driving battery 8 is disposed such that it faces the rear surface side of the circuit board 71 is indicated by a broken line L5A, and sensitivity in the communication apparatus in which a shield plate to which a driving voltage is applied is disposed at the rear surface side of the circuit board 71, and a circuit-driving battery 8 and a rear cover are disposed such that they face the rear surface side of the circuit board 71 is indicated by a broken line L6A.

Figure 6:
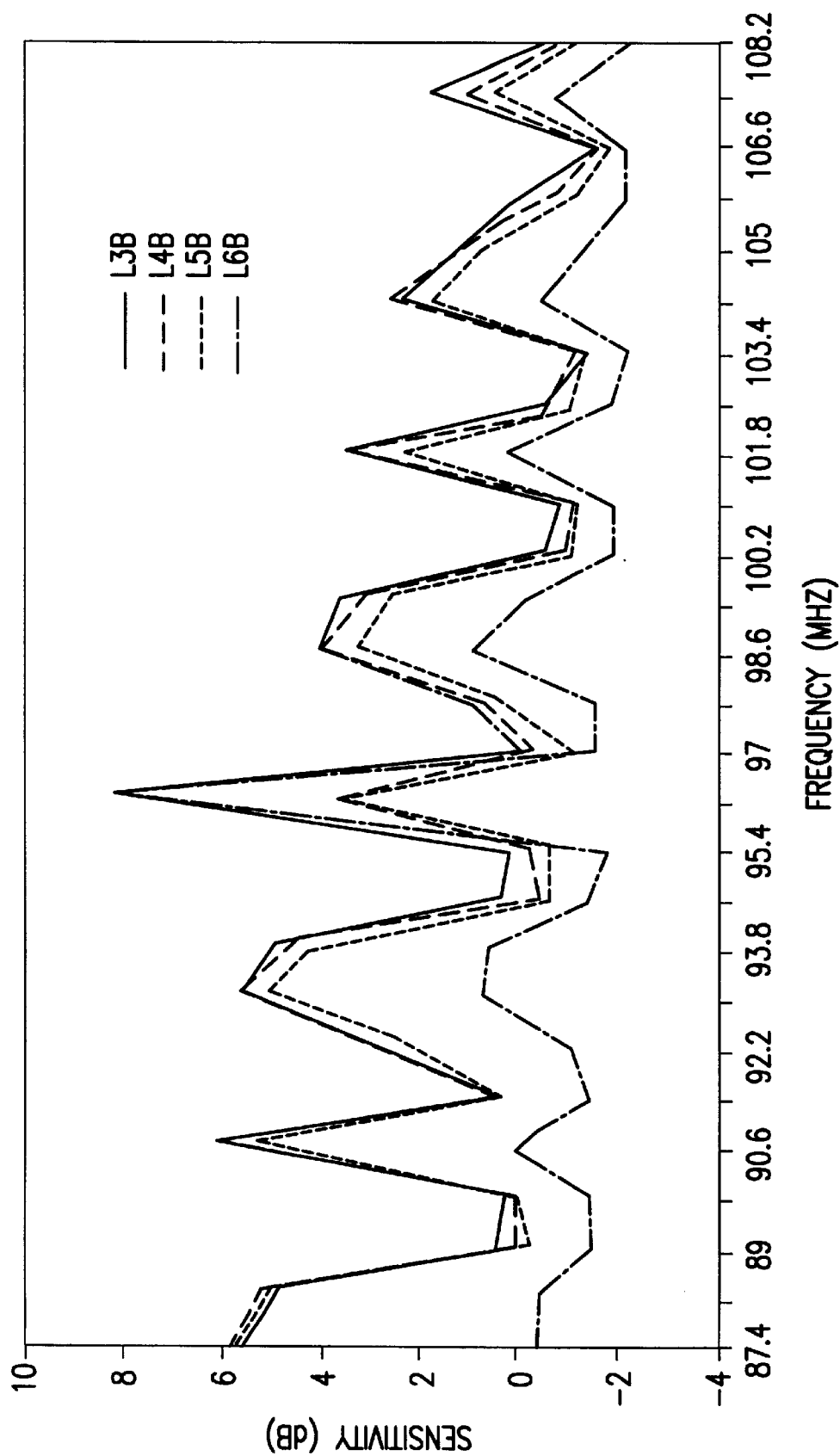
FIG. 6 is a graph indicating the sensitivity characteristics of a wrist-mount-type communication apparatus using the structure according to the comparison case shown in FIG. 3(b), with assembly conditions being changed.

In FIG. 6, in a wrist-mount-type communication apparatus using the structure according to the comparison case, sensitivity in the communication apparatus which has the circuit board 71 on which each IC is mounted as is is indicated by a broken line L3B, sensitivity in the communication apparatus in which the side of the circuit board 71 at which the high-frequency analog IC 91B is mounted is entirely shielded and the circuit-driving battery 8 is disposed such that it faces the rear surface side of the circuit board 71 is indicated by a broken line L4B, sensitivity in the communication apparatus in which both sides of the circuit board 71 are entirely shielded and the circuit-driving battery 8 is disposed such that it faces the rear surface side of the circuit board 71 is indicated by a broken line L5B, and sensitivity in the communication apparatus in which a shield plate to which a driving voltage is applied is disposed at the rear surface side of the circuit board 71, and the circuit-driving battery 8 and a rear cover are disposed such that they face the rear surface side of the circuit board 71 is indicated by a broken line L6B.

The vertical axes in FIGS. 5 and 6 indicate relative sensitivity with the reference sensitivity level being set to 0 dB.

In FIGS. 5 and 6, in either structure, the more shielding measures are applied, the higher the sensitivity becomes. As shown in Table 1 in which sensitivity obtained from the sensitivity characteristics shown in FIGS. 5 and 6 is compared, in any conditions, sensitivity is higher in the structure according to the present invention.

Table 1 also indicates sensitivity measured with another sample in the wrist-mount-type communication apparatuses having the same structures and the same specifications, in parentheses. Values shown in Table 1 are the averages of measured values indicated in each line in FIGS. 5 and 6.

TABLE 1

| Item Structure | Structure in present embodiment [dB] | Structure in comparison case [dB] | Difference in sensitivity of present embodiment to comparison case |
|---|---|---|---|
| Circuit board only | 0.83 (−0.17) | 3.64 (1.87) | 2.81 (2.49) |
| Shielding high-frequency analog IC side + battery | −0.57 (−1.82) | 1.97 (1.54) | 2.54 (3.36) |
| Shielding both sides of circuit board + battery | −0.42 (−1.91) | 1.26 (1.17) | 1.68 (3.08) |
| Shielding rear surface side with driving voltage + battery + rear cover | −0.62 (−2.52) | 0.86 (−0.67) | 1.48 (1.85) |

Figure 7:
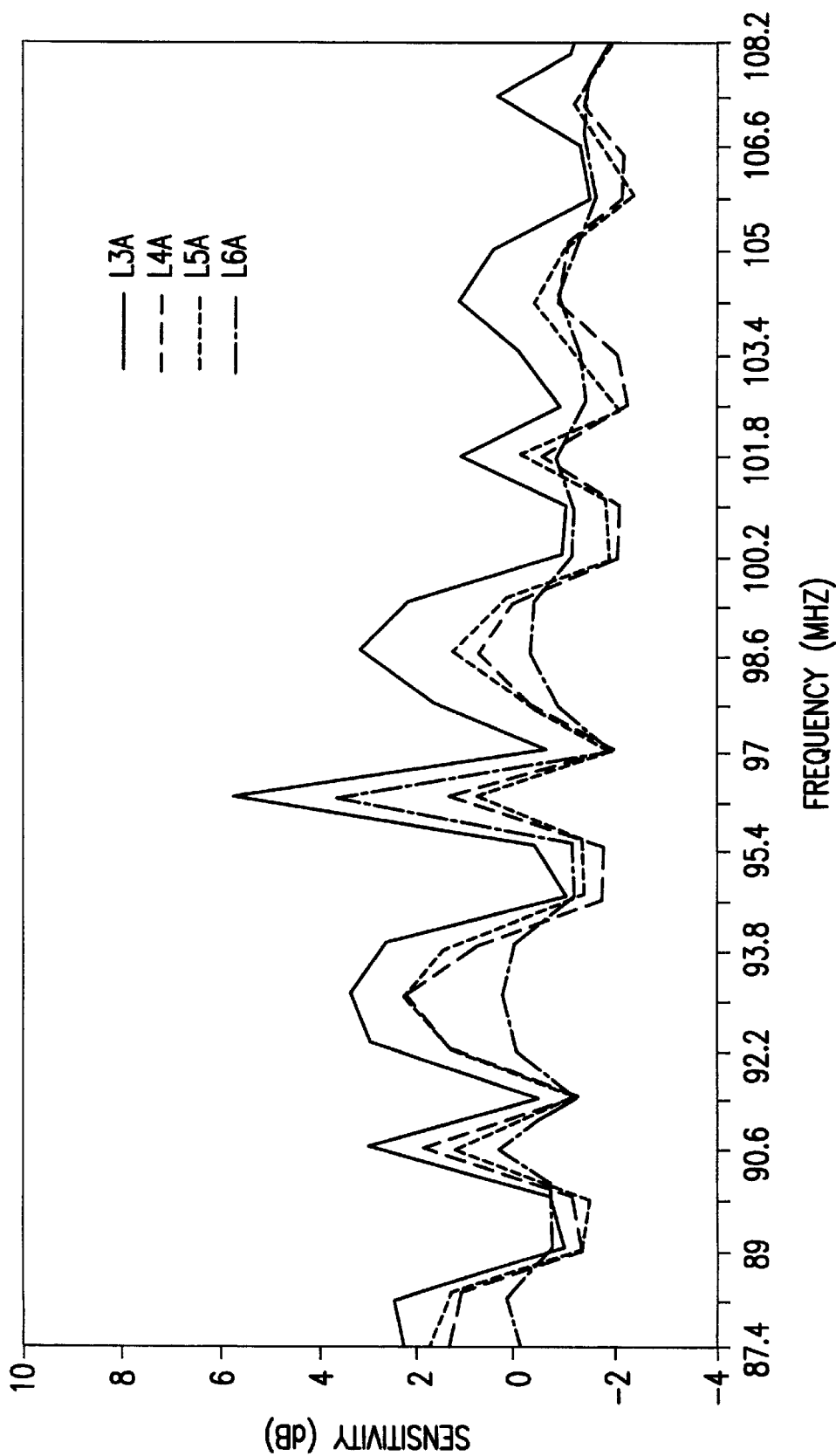
FIG. 7 is a graph indicating the sensitivity characteristics of a wrist-mount-type communication apparatus using the structure according to embodiment 1 shown in FIG. 3(a), with assembly conditions being changed and with a sample other than that used in evaluation shown in FIG. 5.

In FIG. 7, with this another sample in a wrist-mount-type communication apparatus using the structure according to the present embodiment, sensitivity in the communication apparatus which has the circuit board 71 on which each IC is mounted as is is indicated by a broken line L3A, sensitivity in the communication apparatus in which the side of the circuit board 71 at which the high-frequency analog IC 91A is mounted is entirely shielded and the circuit-driving battery 8 is disposed such that it faces the rear surface side of the circuit board 71 is indicated by a broken line L4A, sensitivity in the communication apparatus in which both sides of the circuit board 71 are entirely shielded and the circuit-driving battery 8 is disposed such that it faces the rear surface side of the circuit board 71 is indicated by a broken line L5A, and sensitivity in the communication apparatus in which a shield plate to which a driving voltage is applied is disposed at the rear surface side of the circuit board 71, and the circuit-driving battery 8 and a rear cover are disposed such that they face the rear surface side of the circuit board 71 is indicated by a broken line L6A.

Figure 8:
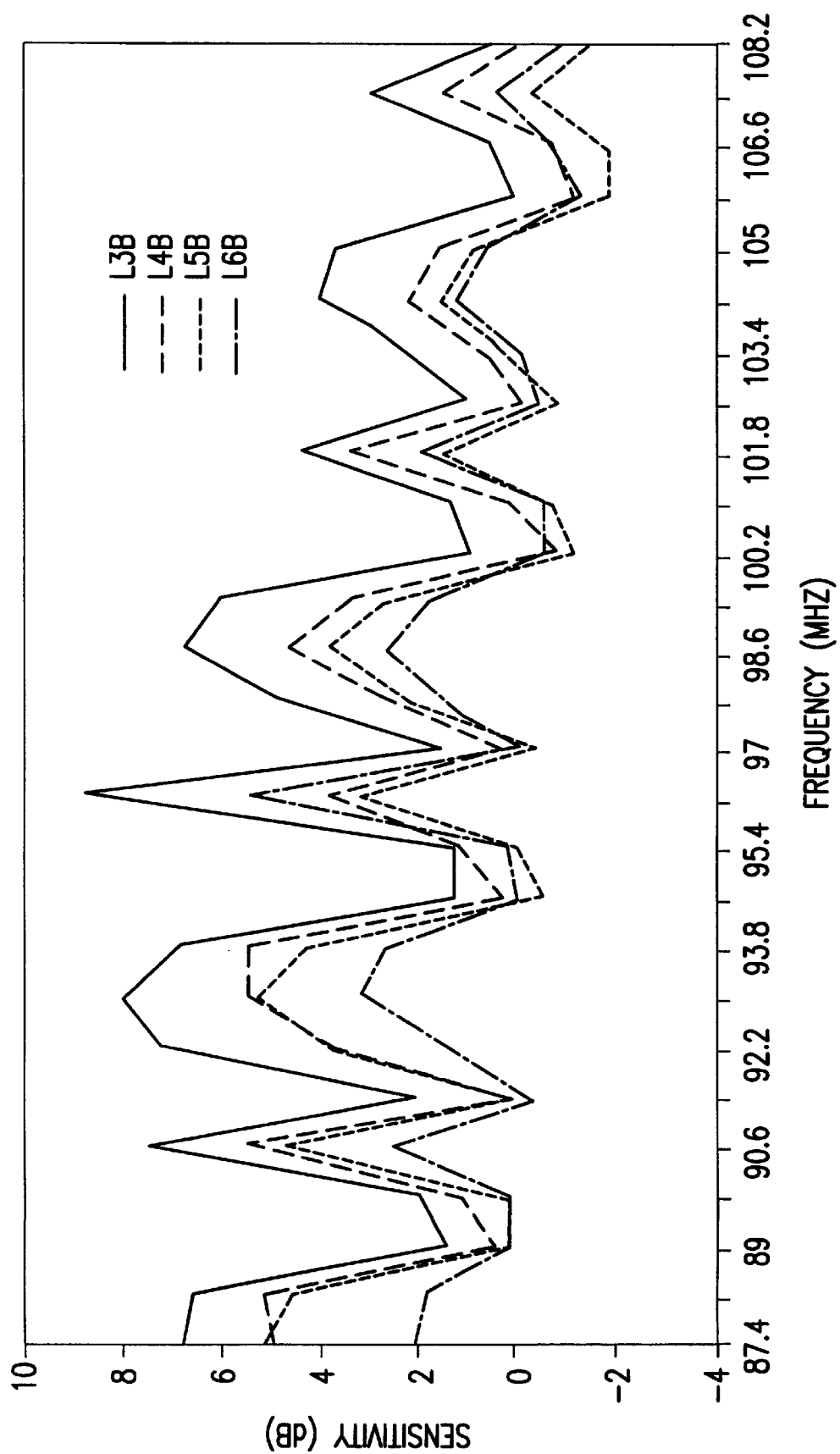
FIG. 8 is a graph indicating the sensitivity characteristics of a wrist-mount-type communication apparatus using the structure according to the comparison case shown in FIG. 3(b), with assembly conditions being changed and with a sample other than that used in evaluation shown in FIG. 6.

In FIG. 8, with this another sample in a wrist-mount-type communication apparatus using the structure according to the comparison case, sensitivity in the communication apparatus which has the circuit board 71 on which each IC is mounted as is is indicated by a broken line L3B, sensitivity in the communication apparatus in which the side of the circuit board 71 at which the high-frequency analog IC 91B is mounted is entirely shielded and the circuit-driving battery 8 is disposed such that it faces the rear surface side of the circuit board 71 is indicated by a broken line L4B, sensitivity in the communication apparatus in which both sides of the circuit board 71 are entirely shielded and the circuit-driving battery 8 is disposed such that it faces the rear surface side of the circuit board 71 is indicated by a broken line L5B, and sensitivity in the communication apparatus in which a shield plate to which a driving voltage is applied is disposed at the rear surface side of the circuit board 71, and the circuit-driving battery 8 and a rear cover are disposed such that they face the rear surface side of the circuit board 71 is indicated by a broken line L6B.

The vertical axes in FIGS. 7 and 8 indicate relative sensitivity with the reference sensitivity level being set to 0 dB.

As a result, as understood from Table 1, FIG. 7, and FIG. 8, it has been confirmed that the advantage of sensitivity increase by use of the structure to which the present invention is applied is repeatedly shown even if measurement is performed with another sample.

Embodiment 2

Since a wrist-mount-type communication apparatus according to the present embodiment is substantially the same in structure as the wrist-mount-type communication apparatus according to the embodiment 1 except that an IC is wire-bonded to a circuit board, it will be described by referring to FIG. 1 and FIG. 2.

In FIG. 1, the wrist-mount-type communication apparatus 1 is formed by an apparatus body 2 which has a liquid crystal display panel 6 (display screen) disposed on the front surface side thereof and a pair of watchbands 4R and 4L. Each of the watchbands 4R and 4L is mounted to both ends of the apparatus body at each watchband main end. These wrist bands can be connected to each other at each sub end by a buckle 41.

The watchbands 4R and 4L are provided with electrically conductive plates thereinside and mounted at the wrist of the user. When the sub ends of the watchbands 4R and 4L are connected, they form a loop antenna 4 (antenna body). A circuit assembly 5 is built in the apparatus body 2.

Figure 9A:
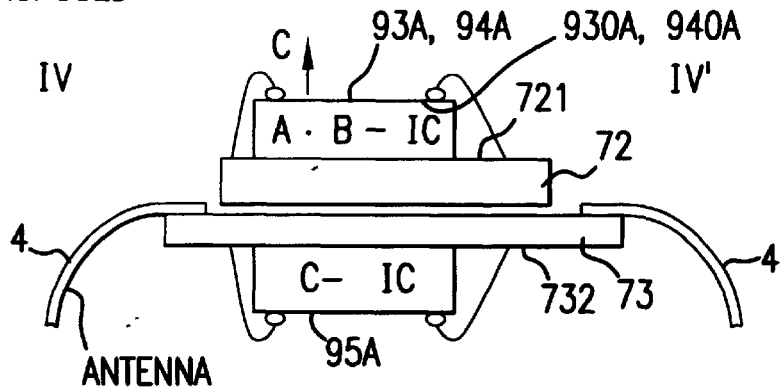
FIG. 9(a) is a view typically indicating a cross section taken on line IV–IV' of a circuit assembly according to embodiment 2 shown in FIG. 2.

FIG. 2(a) and (b) show the front and rear surfaces of the circuit assembly 5, respectively. FIG. 9(a) is a typical cross-sectional view of the circuit assembly 5 taken on line IV–IV' shown in FIG. 2.

In these figures, main components of the circuit assembly 5 are laminated in the thickness direction of the apparatus body 2 in its inside. In other words, in the circuit assembly 5, the liquid crystal display panel 6, a first circuit board 72, a second circuit board 73 mounted to the rear surface side of the first circuit board, and a battery 8 for driving the circuits are disposed in the thickness direction. On the rear surface side (side where the entire or most of the loop antenna 4 is disposed) of the second circuit board 73, a digital IC 95A (indicated by C-IC in the figure) for controlling display operations in the liquid crystal display unit 6 is wire-bonded to the rear surface section 732 thereof.

Various electronic components are mounted on the first circuit board 72. On the front surface side (side where the liquid crystal display panel 6 is disposed) thereof, to the front surface section 721, a high-frequency analog IC 93A having transmission and receiving functions and a signal-processing digital IC 94A are mounted. These ICs (collectively indicated by A•B-IC in the figure) are also wire-bonded to the first circuit board 72. Therefore, the active surfaces 930A and 940A of the high-frequency analog IC 93A and the signal-processing digital IC 94A face the liquid crystal display panel 6 and do not face the direction where the loop antenna 4 is disposed.

The digital IC 95A for liquid crystal display is driven by a driving signal having a frequency as relatively low as several tens of kHz, and does not generate high-frequency noise. On the other hand, since the high-frequency analog IC 93A transmits and receives high-frequency signals in the range of several tens of MHz to several hundreds of MHz, it generates high-frequency noise as shown by arrow C. Since the signal-processing digital IC 94A includes a digital circuit for sampling a received signal before analog/digital conversion and a phase locked loop circuit, and is driven by a driving signal having a frequency as high as several MHz, it generates high-frequency noise as indicated by arrow C.

In this embodiment, however, the high-frequency analog IC 93A and the signal-processing digital IC 94A both generating high-frequency noise are disposed at the front surface side of the first circuit board 72 with the active surfaces 930A and 940A thereof directing toward the liquid crystal display panel 6 and not directing at the loop antenna 4. Therefore, the effect of the high-frequency noise generated by them is unlikely to reach the loop antenna 4. Therefore, the wrist-mount-type communication apparatus 1 to which the present invention is applied has high sensitivity.

Figure 9B:
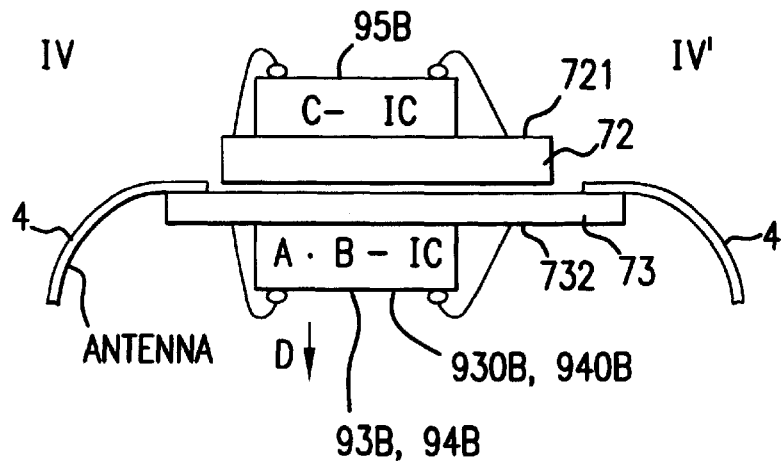
FIG. 9(b) is a view typically indicating a cross section taken on a position corresponding to line IV–IV' of a circuit assembly according to a conventional case.

To examine the noise reduction effect, the structure in the present embodiment shown in FIG. 9(*a*) and a conventional structure shown in FIG. 9(*b*) in which a digital IC 95B for controlling display operations in the liquid crystal display panel 6 is wire-bonded to the front surface section 721 of the first circuit board 72 and a high-frequency analog IC 93B and a signal-processing digital IC 94B both serving as high-frequency noise generation sources are wire-bonded to the rear surface section 732 of the second circuit board 73 are relatively compared in terms of sensitivity in receiving.

As a result, sensitivity is −3.0 dB in relative sensitivity against the reference sensitivity in the wrist-mount-type communication apparatus 1 according to the present embodiment in which the high-frequency analog IC 93A and the signal-processing digital IC 94A both serving as high-frequency noise generation sources are wire-bonded to the front surface section 721 of the first circuit board 72 to direct the active surfaces 930A and 940A thereof toward the liquid crystal display panel 6. In contrast, sensitivity is −2.0 dB in relative sensitivity against the reference sensitivity in the conventional wrist-mount-type communication apparatus in which the high-frequency analog IC 93B and the signal-processing digital IC 94B both serving as high-frequency noise generation sources are wire-bonded to the rear surface section 732 of the second circuit board 73 to direct the active surfaces 930B and 940B thereof toward the loop antenna 4. In other words, in the structure according to the present embodiment, high-frequency noise emitted from the active surfaces 930A and 940A of the high-frequency analog IC 93A and the signal-processing digital IC 94A is not emitted toward the loop antenna 4 as shown by arrow C in FIG. 9(*a*), whereas in the conventional structure, high-frequency noise emitted from the active surfaces 930B and 940B of the high-frequency analog IC 93B and the signal-processing digital IC 94B is emitted toward the loop antenna 4 as shown by arrow D in FIG. 9(*b*). Therefore, in the structure according to the present embodiment, sensitivity is higher by 1.0 dB than in the comparison case.

Figure 10:
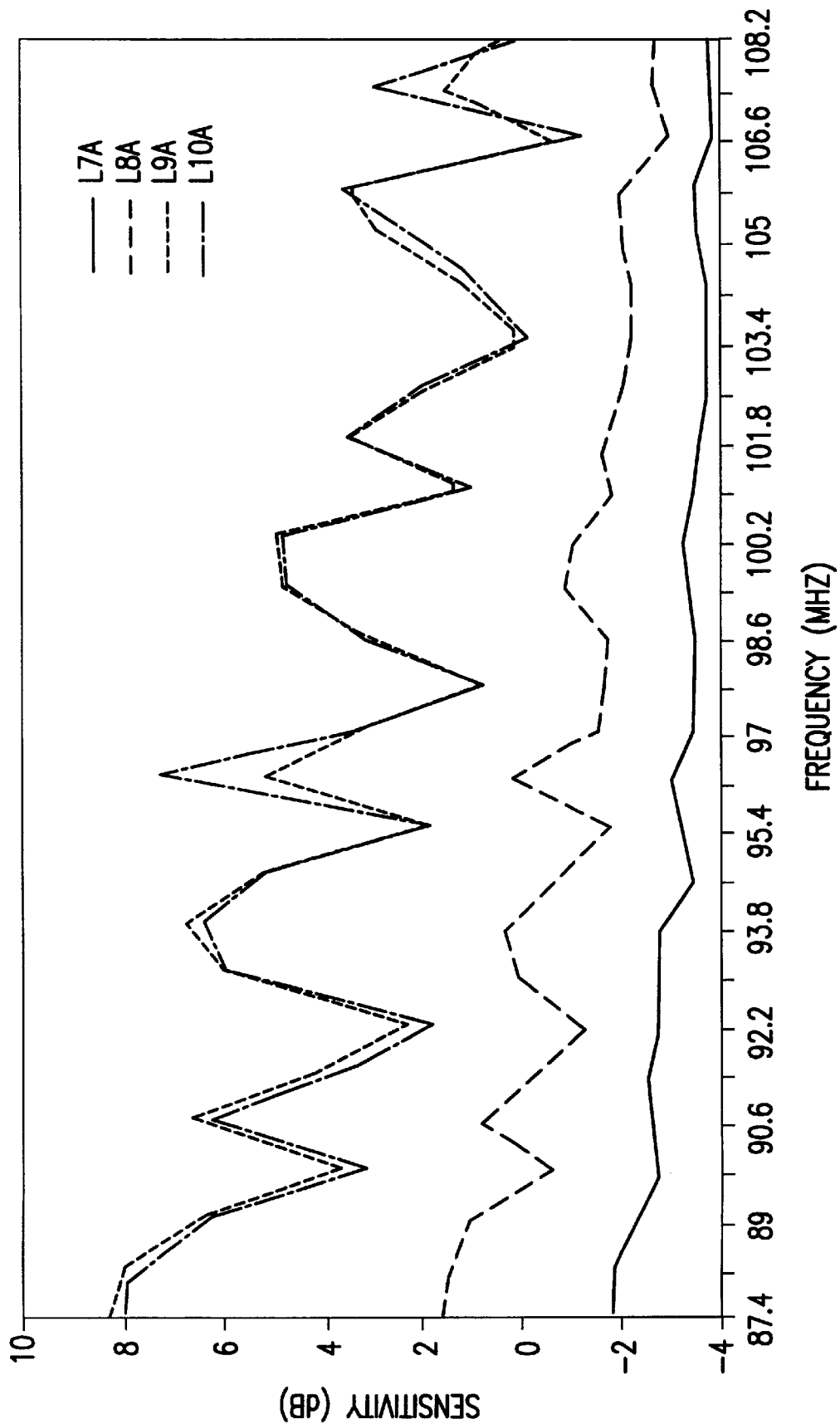
FIG. 10 is a graph indicating the sensitivity characteristics of a wrist-mount-type communication apparatus using the structure according to embodiment 2 shown in FIG. 9(a), with assembly conditions being changed.

In FIG. 10, in the wrist-mount-type communication apparatus 1 using the structure according to the present embodiment, sensitivity in the communication apparatus as a final product is indicated by a broken line L7A, sensitivity in the communication apparatus in which a rear cover to be disposed on the rear surface side of the second circuit board 73 is removed is indicated by a broken line L8A, sensitivity in the communication apparatus in which the rear cover and a battery 8 for driving the circuits both to be disposed at the rear surface side of the second circuit board 73 are removed is indicated by a broken line L9A, and sensitivity in the communication apparatus formed only by the first and second circuit boards 72 and 73 is indicated by a broken line L10A.

Figure 11:
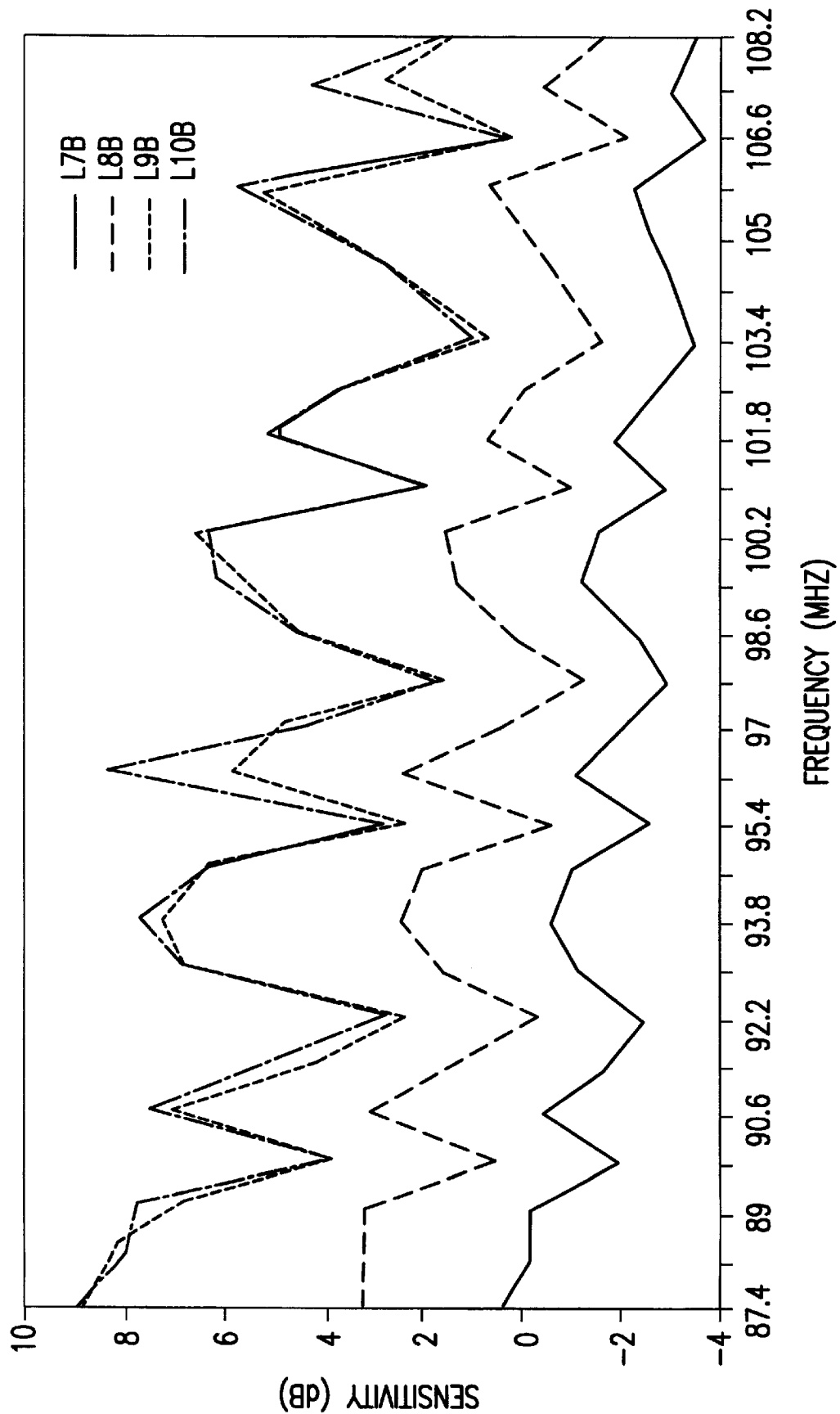
FIG. 11 is a graph indicating the sensitivity characteristics of a wrist-mount-type communication apparatus using the structure according to the conventional case shown in FIG. 9(b), with assembly conditions being changed.

In FIG. 11, in the conventional wrist-mount-type communication apparatus, sensitivity in the communication apparatus as a final product is indicated by a broken line L7B, sensitivity in the communication apparatus in which the rear cover to be disposed on the rear surface side of the second circuit board 73 is removed is indicated by a broken line L8B, sensitivity in the communication apparatus in which the rear cover and the battery 8 for driving the circuits both to be disposed at the rear surface side of the second circuit board 73 are removed is indicated by a broken line L9B, and sensitivity in the communication apparatus formed only by the first and second circuit boards 72 and 73 is indicated by a broken line L10B.

The vertical axes in FIGS. 10 and 11 indicate relative sensitivity with the reference sensitivity level being set to 0 dB.

In FIGS. 10 and 11, in either structure, the more the apparatus used approaches the final product, the higher the sensitivity becomes. As shown in Table 2 in which sensitivity obtained from the sensitivity characteristics shown in FIGS. 10 and 11 is compared, in any conditions, sensitivity is higher in the structure according to the present invention.

Table 2 also indicates sensitivity measured with another sample in the wrist-mount-type communication apparatuses having the same structures and the same specifications, in parentheses. Values shown in Table 2 are the averages of measured values indicated in each line in FIGS. 10 and 11.

TABLE 2

| Item Structure | Structure in present embodiment [dB] | Structure in comparison case [dB] | Difference in sensitivity of present embodiment to comparison case |
|---|---|---|---|
| Final product | −3.18 (−3.04) | −1.95 (−2.41) | 1.23 (0.63) |
| With rear cover being removed | −1.06 (2.00) | 0.64 (−0.85) | 1.70 (1.15) |
| Wither rear cover and battery being removed | 3.62 (1.70) | 4.49 (2.72) | 0.87 (1.02) |
| Formed only by circuit boards | 3.56 (2.14) | 4.78 (2.66) | 1.22 (0.52) |

Figure 12:
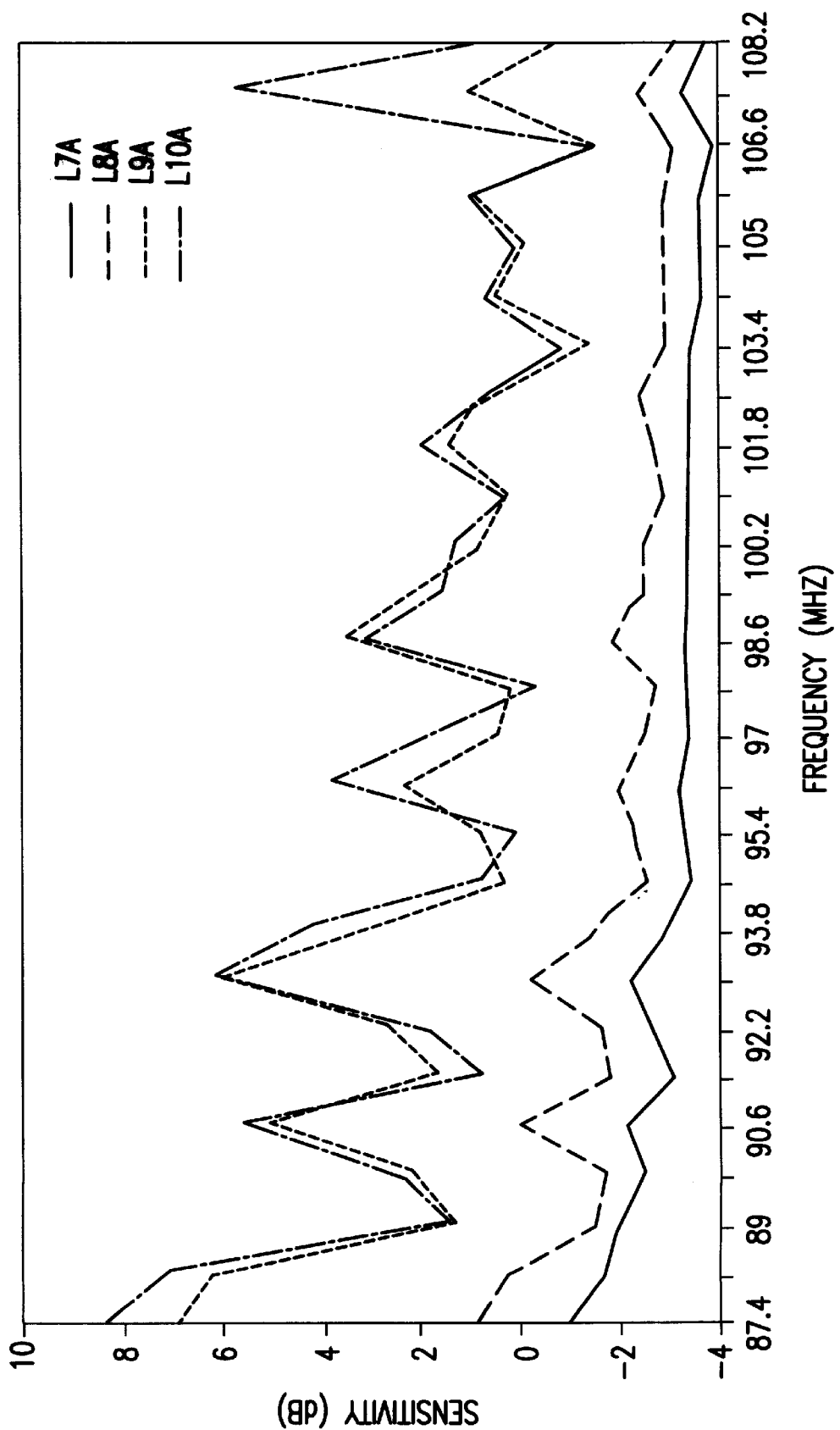
FIG. 12 is a graph indicating the sensitivity characteristics of a wrist-mount-type communication apparatus using the structure according to embodiment 2 shown in FIG. 9(a), with assembly conditions being changed and with a sample other than that used in evaluation shown in FIG. 10.

In FIG. 12, with this another sample in a wrist-mount-type communication apparatus 1 using the structure according to the present embodiment, sensitivity in the communication apparatus as a final product is indicated by a broken line L7A, sensitivity in the communication apparatus in which the rear cover to be disposed on the rear surface side of the second circuit board 73 is removed is indicated by a broken line L8A, sensitivity in the communication apparatus in which the rear cover and the battery 8 for driving the circuits both to be disposed at the rear surface side of the second circuit board 73 are removed is indicated by a broken line L9A, and sensitivity in the communication apparatus formed only by the first and second circuit boards 72 and 73 is indicated by a broken line L10A.

Figure 13:
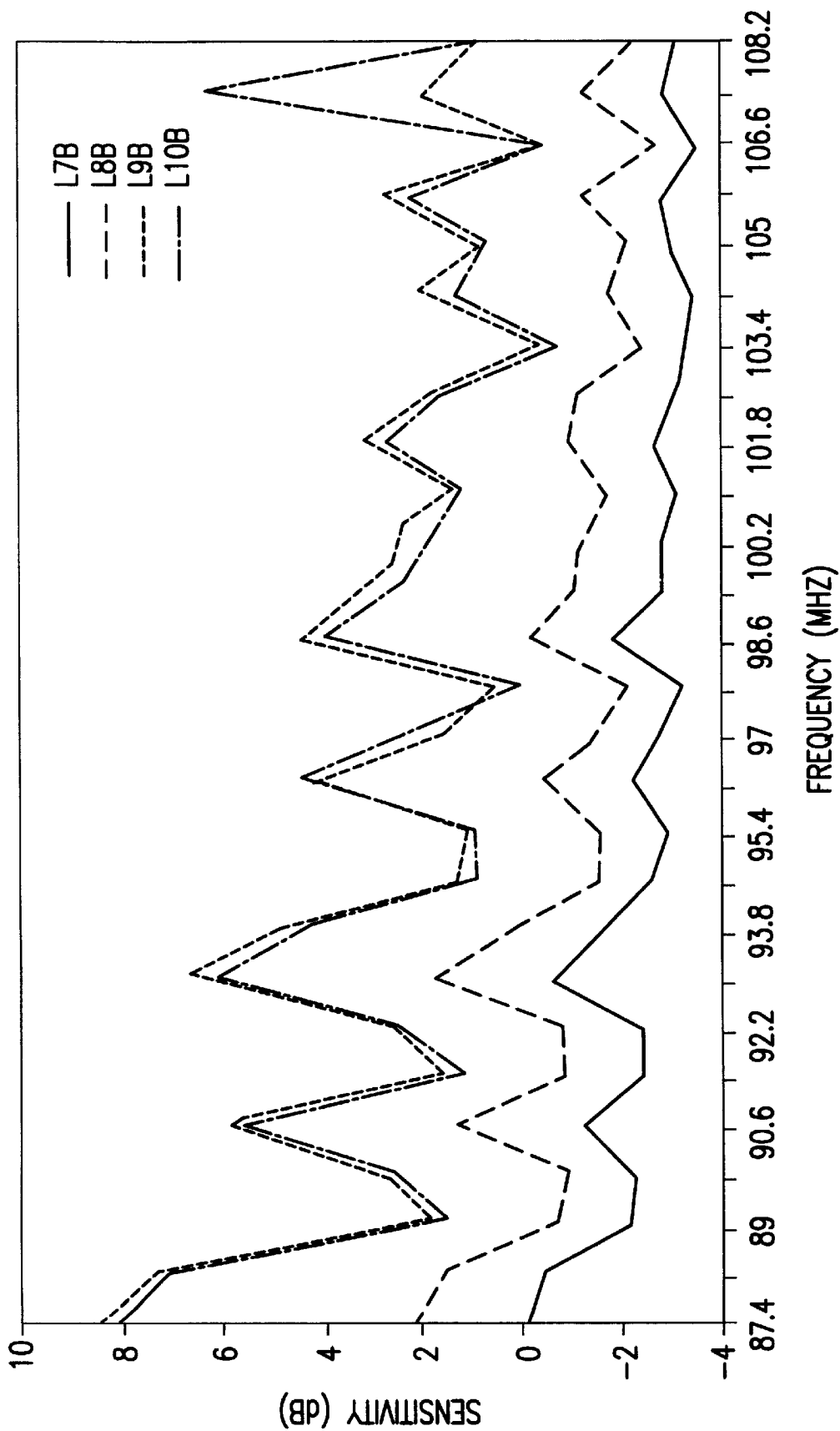
FIG. 13 is a graph indicating the sensitivity characteristics of a wrist-mount-type communication apparatus using the structure according to the conventional case shown in FIG. 9(b), with assembly conditions being changed and with a sample other than that used in evaluation shown in FIG. 11.

In FIG. 13, with this another sample in a conventional wrist-mount-type communication apparatus, sensitivity in the communication apparatus as a final product is indicated by a broken line L7B, sensitivity in the communication apparatus in which the rear cover to be disposed on the rear surface side of the second circuit board 73 is removed is indicated by a broken line L8B, sensitivity in the communication apparatus in which the rear cover and the battery 8 for driving the circuits both to be disposed at the rear surface side of the second circuit board 73 are removed is indicated by a broken line L9B, and sensitivity in the communication apparatus formed only by the first and second circuit boards 72 and 73 is indicated by a broken line L10B.

The vertical axes in FIGS. 12 and 13 indicate relative sensitivity with the reference sensitivity level being set to 0 dB.

As a result, as understood from Table 2, FIG. 12, and FIG. 13, it has been confirmed that the advantage of sensitivity increase by use of the structure according to the present embodiment is repeatedly shown even if measurement is performed with another sample.

Embodiment 3

Figure 14A:
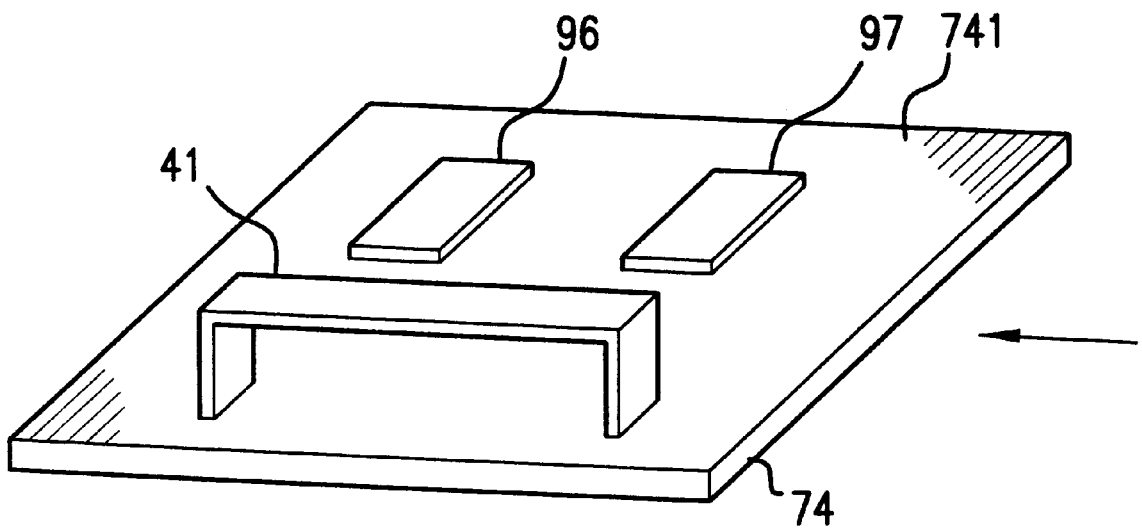
FIG. 14(a) is a perspective view typically showing arrangement of an antenna body and a circuit board in a communication apparatus according to embodiment 3.
Figure 14B:
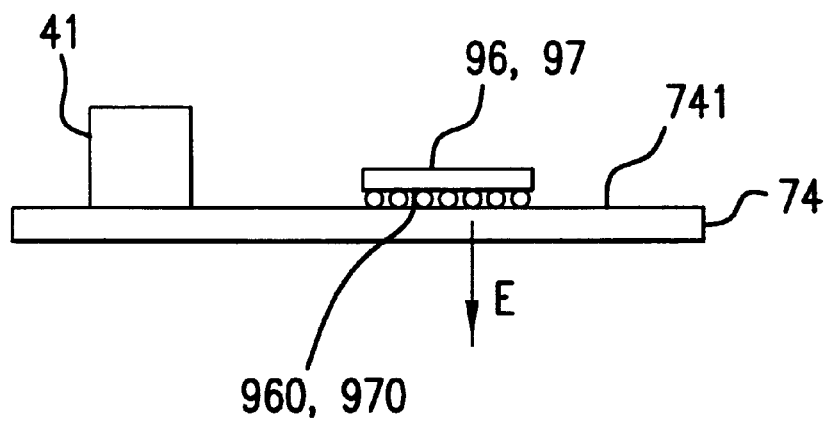
FIG. 14(b) is a side view of the structure.

In the embodiments 1 and 2, in a wrist-mount-type communication apparatus including an apparatus body which has as the front surface side a side on which a display screen is formed and an antenna body formed in a watchband for mounting the apparatus body to the wrist, ICs generating high-frequency noise are mounted on a circuit board such that the active surfaces thereof direct at the display screen side (side opposite the side where the entire or most of the antenna body is disposed against the circuit board). As shown in FIGS. 14(a) and 14(b), the present invention can also be applied to a communication apparatus in which ICs and an antenna body are formed on the same circuit board.

FIG. 14(a) is a typical perspective view indicating arrangement of an antenna body and a circuit board in a communication apparatus according to embodiment 3. FIG. 14(b) is a side view of the structure.

As shown in FIG. 14(a), the communication apparatus according to the present embodiment includes a circuit board 74 on which various electronic components are mounted and an antenna body 41 formed on one surface 741 of the circuit board 74. Among the electronic components, ICs generating high-frequency noise, such as a high-frequency analog IC 96 and a signal-processing digital IC 97, are all mounted on the same surface 741 as the antenna body 41 is mounted, against the circuit board 74.

Since the high-frequency analog IC 96 and the signal-processing digital IC 97 are face-down-bonded to the circuit board 74 as shown in FIG. 14(b), the active surfaces 960 and 970 thereof face the direction opposite the direction where the antenna body 41 is disposed against the circuit board 74. Therefore, in the communication apparatus according to the present embodiment, if high-frequency noise is emitted from the active surfaces 960 and 970 of the high-frequency analog IC 96 and the signal-processing digital IC 97 as indicated by arrow E, the effect of the high-frequency noise is unlikely to reach the antenna body 41 and sensitivity is high.

Embodiment 4

Figure 15A:
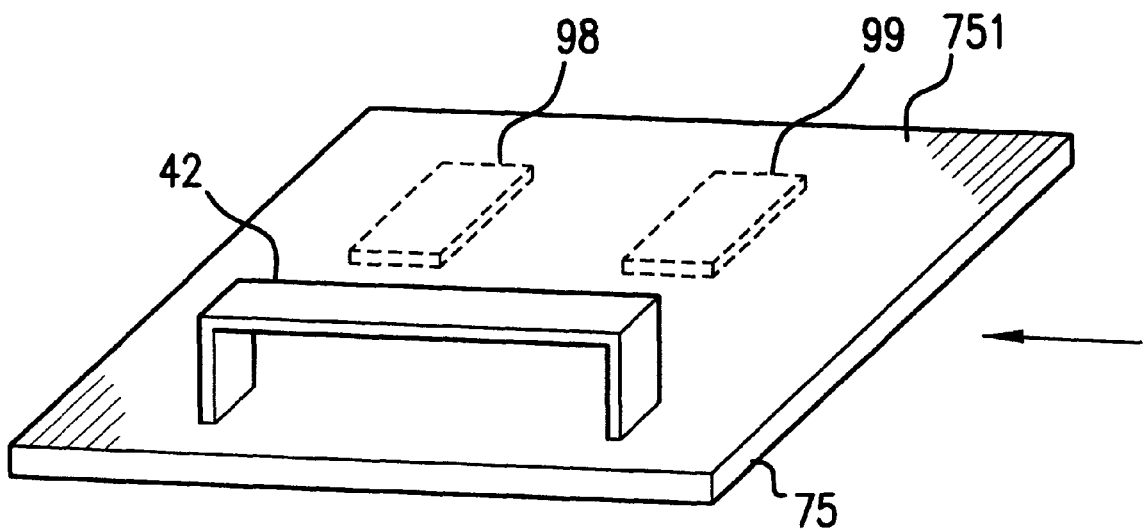
FIG. 15(a) is a perspective view typically showing arrangement of an antenna body and a circuit board in a communication apparatus according to embodiment 4.
Figure 15B:
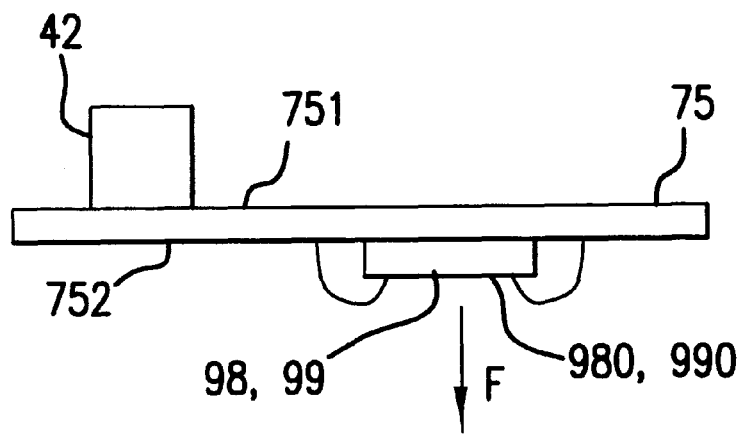
FIG. 15(b) is a side view of the structure.

FIG. 15(a) is a typical perspective view indicating arrangement of an antenna body and a circuit board in a communication apparatus according to embodiment 4. FIG. 15(b) is a side view of the structure.

As shown in FIG. 15(a), the communication apparatus according to the present embodiment includes a circuit board 75 on which various electronic components are mounted and an antenna body 42 formed on one surface 751 of the circuit board 75. Among the electronic components, ICs generating high-frequency noise, such as a high-frequency analog IC 98 and a signal-processing digital IC 99, are all mounted on the surface 752 opposite the surface on which the antenna body 42 is mounted against the circuit board 75.

Since the high-frequency analog IC 98 and the signal-processing digital IC 99 are wire-bonded to the circuit board 75 as shown in FIG. 15(b), the active surfaces 980 and 990 thereof face the direction opposite the direction where the antenna body 41 is disposed against the circuit board 75. Therefore, also in the communication apparatus according to the present embodiment, if high-frequency noise is emitted from the active surfaces 980 and 990 of the high-frequency analog IC 98 and the signal-processing digital IC 99 as indicated by arrow F, the effect of the high-frequency noise is unlikely to reach the antenna body 941 and sensitivity is high.

Other Embodiments

In each embodiment, a loop antenna is used as an antenna body. A slit may be formed in the longitudinal direction of the antenna body to form a slot antenna.

Not only in a case in which an antenna body is formed on a circuit board on which an IC is mounted but also in a case in which an antenna body is formed on a base member different from a circuit board, when an IC generating high-frequency noise is mounted on the circuit board such that the active surface thereof directs at the direction opposite the direction where the entire or most of the antenna body is disposed against the circuit board, if high-frequency noise is emitted from the active surface of the integrated circuit, the effect of the high-frequency noise unlikely reach the antenna body and an advantage of high sensitivity is obtained.

Industrial Applicability

In a communication apparatus according to the present invention, the active surface of an integrated circuit generating high-frequency noise directs at the direction opposite the direction where the entire or most of the antenna body is disposed against the circuit board. In other words, the active surface of the integrated circuit generating high-frequency noise does not direct toward the antenna. Therefore, if high-frequency noise is emitted from the active surface of the integrated circuit, the high-frequency noise is unlikely reach the antenna body, and the communication apparatus having a high sensitivity is implemented.

In addition, the present invention can be applied to any types of communication apparatuses, such as a watch having an FM radio, a watch-type individual-selective-calling receiver, a pocket pager, a portable phone, a PHS.

What is claimed is:

1. A communicator comprising: a board on which is mounted at least one integrated circuit having an active surface from which high-frequency noise is generated; and an antenna, wherein said antenna forms a loop on one side of said board, wherein each at least one integrated circuit is mounted on said board such that the active surface faces away from said loop.

2. The communicator of claim 1, further comprising: a body having a display screen formed on a front surface; and a watchband extending from said body toward the rear for mounting said body to a wrist, wherein said antenna is formed in said watchband, and said board is disposed to the rear of said display screen in said body.

3. The communicator of claim 1, wherein said at least one integrated circuit includes at least one of a high-frequency analog integrated circuit, having at least one of a transmission function and a receiving function, and a signal-processing digital integrated circuit driven by a high-frequency driving signal.

4. The communicator of claim 1, wherein said integrated circuit is face-down-bonded to a board surface so that said active surface faces away from said loop.

5. The communicator of claim 1, wherein said integrated circuit is wire-bonded to a board surface opposite the one side of said board on which sad loop is formed so that said active surfaces away from said loop.

6. A communicator having at least one circuit substrate, the communicator comprising:

an antenna; and at least one integrated circuit that produces high-frequency is face-down-bonded to a first face of the circuit substrate, wherein the high-frequency noise is emitted from each at least one integrated circuit toward a first face of the circuit substrate, wherein the antenna is positioned away from a direction in which the high-frequency noise is emitted by each at least one integrated circuit.

7. The communicator of claim 6, wherein the antenna forms a loop on a side of the at least one circuit substrate corresponding to the first face of the at least one circuit substrate.

8. The communicator of claim 6, wherein the at least one integrated circuit is flip-chip-bonded to the first face of the at least one circuit substrate.

9. The communicator of claim 6, wherein the antenna is a loop antenna and wherein each at least one integrated circuit is arranged to emit the high-frequency noise away from a center of the loop antenna.

10. A communicator having at least one circuit substrate, the at least one circuit substrate having first and second faces the communicator comprising:

an antenna; and at least one integrated circuit that produces high-frequency noise and is wire-bonded to the second face of the circuit substrate, wherein each at least one integrated circuit produces the high-frequency noise in a direction away from the second face and wherein the antenna is positioned away from a direction in which the high-frequency noise is emitted by each at least one integrated circuit.

11. The communicator of claim 10, wherein the antenna forms a loop, most of the loop being positioned on a side of the at least one circuit substrate corresponding to the first surface of the at least one circuit substrate.

12. The communicator of claim 10, wherein the antenna is a loop antenna and wherein each at least one integrated circuit is arranged to emit the high-frequency noise in a direction away from a center of the loop antenna.

* * * * *